United States Patent [19]

Briska et al.

[11] 3,971,683

[45] July 27, 1976

[54] METHOD OF ETCHING MATERIALS CONTAINING SILICON

[75] Inventors: Marian Briska, Boeblingen; Wolfgang Hoffmeister, Gaertringen; Herbert Kuhlmey, Boeblingen, all of Germany

[73] Assignee: International Business Machines Corporation, Armonk, N.Y.

[22] Filed: Apr. 21, 1975

[21] Appl. No.: 570,068

[30] Foreign Application Priority Data

May 28, 1974 Germany............................. 2425684

[52] U.S. Cl.................................. 156/13; 156/17; 252/79.2
[51] Int. Cl.².................. H01L 21/318; C09K 13/04
[58] Field of Search ...................... 156/7, 13, 17, 8; 252/79.1, 79.2; 423/304

[56] References Cited

UNITED STATES PATENTS

| | | | |
|---|---|---|---|
| 3,715,249 | 2/1973 | Panousis et al. .................... | 252/79.2 |
| 3,871,931 | 3/1975 | Godber............................. | 252/79.2 |

OTHER PUBLICATIONS

Van Gelder et al., "The Etching of Silicon Nitride in Phosphoric Acid with Silicon Dioxide as a Mask, "*Journal of the Electrochemical Society,*" vol. 114 (1967), pp. 869–872.

*Primary Examiner*—Douglas J. Drummond
*Assistant Examiner*—Jerome W. Massie
*Attorney, Agent, or Firm*—David M. Bunnell

[57] ABSTRACT

The invention relates to a method of etching solid, chemically resistant materials containing silicon (Si) by means of a hot melt made up of phosphorous pentoxide ($P_2O_5$) and phosphoric acid ($H_3PO_4$) (anhydrous).

10 Claims, 9 Drawing Figures

METHOD OF ETCHING MATERIALS CONTAINING SILICON

BACKGROUND OF THE INVENTION

Etching methods are used in many fields of technology, such as in semiconductor technology, to remove unwanted material. For this purpose it is advantageous to have several suitable etchants for a particular material, in order to flexibly meet requirements concerning the etch rate, the accuracy and reproducibility of the etch rate, the handling (safety) as well as requirements relating to other materials that are also exposed to etchants. If small quantities of material are to be removed, it is desirable for etching to proceed slowly, so that the process as such can be readily controlled. For the removal of great quantities of material, on the other hand, it is preferable to have a high etch rate, to curtail the time required for etching. In particular for the removal of small quantities of material the etch process must be readily reproducible, since it is difficult to follow. To this end it is necessary for the composition of the etchant to be constant and for etching to be performed under constant conditions. In many instances the etch process is directed to generating an etched pattern, i.e., only predetermined areas of the workpiece to be processed may be attacked by the etchant. In these cases, the areas of the workpiece which are not to be attacked are covered with what is known as an "etch mask". For this purpose it is essential that during the etching of the non-masked areas the mask is not destroyed, thus becoming useless. This means, in other words, that the etchant employed etches selectively the material to be etched, so that the mask material is either attacked not at all or noticeably less than the material to be etched. Semiconductor technology is a field in which selective etching plays an important role.

In many instances it is not desirable for the selectivity of an etchant to be such that the material to be etched is heavily attacked, whereas the surrounding materials are not at all or only negligibly affected. In semiconductor technology, materials containing Si, such as $Si_3N_4$, $SiO_2$ and Si, are frequently used side-by-side. It may be advantageous that in cases where $Si_3N_4$ or $SiO_2$ are to be etched selectively, $SiO_2$ and Si and $Si_3N_4$ and Si, respectively, are also attacked, even though only to a limited degree. If, for example, an $Si_3N_4$ layer covered with an $SiO_2$ mask is to be etched, it may well happen that the $SiO_2$ mask is defective, so that parts of the $Si_3N_4$ areas to be etched are covered with $SiO_2$ residues. If in such cases the $Si_3N_4$ is etched by an etchant that only attacks $Si_3N_4$, it is necessary to either remove the $SiO_2$ residues in an additional step preceding the actual $Si_3N_4$ etch process or to put up with an imperfectly etched $Si_3N_4$ layer. If, on the other hand, an etchant is used which, in addition to $Si_3N_4$, attacks $SiO_2$, although on a reduced scale, the $SiO_2$ residues and the $Si_3N_4$ not covered with the non-defective etch mask can be removed in one etching step.

Etchants for materials containing Si are known. Thus, for example, the etchants best known for $SiO_2$ are hydrofluoric acid (HF) and hydrofluoric acid buffered with ammonium fluoride ($NH_4F$), respectively, which attack Si and $Si_3N_4$ hardly at all. Buffered hydrofluoric acid is favorable for high etch rates (>500 A/min.). For low etch rates, on the other hand, it is necessary to use a buffered hydrofluoric acid containing a great quantity of $NH_4F$ and a small quantity of HF. As $NH_4F$ is hydrolysed according to the equation: $2NH_4F + H_2O = NH_4F \cdot HF + NH_4OH$, the hydrolysis is a function of the temperature and equilibrium is obtained slowly, the percentage of the existent small quantity of HF is considerably reduced and uncontrollably changed by the generated $NH_4OH$. Therefore, low etch rates are difficult to reproduce. Etchants primarily used for Si are those containing HF and an oxidation agent, preferably nitric acid ($HNO_3$). By these etchants $SiO_2$ is etched at least equally well as Si. Difficulties may be encountered, because in the usual Si etchants $Si_3N_4$ is etched either not at all or essentially less than Si.

The etchant most frequently used for $Si_3N_4$ is hydrous phosphoric acid. A method used to this end is described, for example, in German Pat. No. 1,614,909. The most concentrated phosphoric acid used for this method contains 15 percent water. With this or higher percentages of water neither $SiO_2$ nor Si is noticeably attacked. In addition to the temperature, the etch rate of $Si_3N_4$ in phosphoric acid is essentially influenced by the water concentration, and since phosphoric acid has to be heated for etching, it is either necessary in the interest of a constant etch rate to quantatively condense all of the evaporated water by complicated precautionary measures and to refeed it into the etch tank, or to put up with $Si_3N_4$ etch rates that become gradually lower and lower.

In the *Journal of the Electrochemical Society*, Vol. 114, p. 869 ff. (1967) van Gelder and Hauser published an article "The Etching of Silicon Nitride in Phosphoric Acid with Silicon Dioxide as a Mask". The authors found that in a highly concentrated, aqueous solution containing over 85 percent phosphoric acid the etch rate of $Si_3N_4$ increases as the water content increases and that the etch rate of $SiO_2$ increases as the water content decreases. From the authors' test results it can be concluded that in 100 percent, i.e., anhydrous, phosphoric acid $SiO_2$ is etched more intensely than $Si_3N_4$. Gelder and Hauser, too, were confronted with the alternative of either etching in an open beaker, putting up with a steadily increasing $SiO_2$ and a steadily decreasing $Si_3N_4$ etch rate, or to condense the evaporating water by complicated precautionary measures and to steadily and continuously refeed it into the etching solution.

Van Gelder and Hauser in their above-mentioned article refer to etch rates of $SiO_2$ and $Si_3N_4$ in an $H_3PO_4/P_2O_5$ melt (indicated $P_2O_5$ content: >10.4%), as shown by the two curves at the right hand side of FIG. 4 of the specification. This data does not indicate that $Si_3N_4$ could be peferentially etched with respect to $SiO_2$ at higher $P_2O_5$ contents because the $SiO_2$ etch rate appears to be rapidly increasing with increasing $P_2O_5$ content.

BRIEF SUMMARY OF THE INVENTION

It is the object of the invention to provide an etching method, by means of which solid, chemically resistant materials containing Si can be etched, which permits adapting the etch rate to the layer thicknesses to be etched, maintaining constant or at least accurately defined etch rates within the permissible tolerances for prolonged operation periods, and which, in addition, can be safely and economically applied in such a manner that it is suitable for manufacturing purposes.

According to the invention these objects are achieved by a method in which a hot melt of $H_3PO_4/P_2O_5$, which contains at least 12 percent $P_2O_5$, is used for etching the materials containing Si. This percentage and any subsequent percentages described below are percentages by weight and unless information to the contrary is given, the $H_3PO_4$ is anhydrous.

DESCRIPTION OF THE DRAWINGS

The invention will be described below by means of drawings and embodiments, in which.

DETAILED DESCRIPTION

Figure 1A:
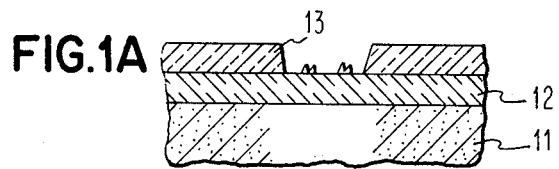
FIG. 1A is a cross-sectional view of an $SiO_2$ or $Si_3N_4$ layer disposed on a substrate and covered with a mask of $Si_3N_4$ or Si and $SiO_2$ or Si, respectively.

According to the process of the invention several materials containing silicon can be etched concurrently at suitably adapted etch rates and without taking complicated precautionary measures. Essentially, more constant etch rates can be obtained than with phosphoric acid that is more or less anhydrous. The latter advantage renders the method in accordance with the invention particularly attractive. The advantage is attributable to the fact that firstly within a larger or smaller range of the $P_2O_5$ contents the etch rates of at least some of th materials containing silicon, such as $SiO_2$, Si and $Si_3N_4$, are less dependent upon the composition used or at least less dependent than with hydrous phosphoric acid. Secondly, although $H_3PO_4/P_2O_5$ mixtures emit water at higher temperatures, resulting in a change of the composition, the temperatures at which the water is emitted increase as the $P_2O_5$ content increases, so that as the $P_2O_5$ content rises, it is simpler to keep the composition of the melt constant. In addition, $H_3PO_4/P_2O_5$ melts have the characteristic that even at the higher temperatures the water is emitted very slowly. The water emission speed increases though as the temperature increases. However, even when melts with low $P_2O_5$ contents are heated to high temperatures, the inventive method still permits maintaining a constant etch rate for a short period of time as well as an accurately defined and reproducible etch rate for a long period of time. Even at low etch rates the method in accordance with the invention ensures constant, accurate and reproducible etching results. This is essential, since low etch rates are more difficult to control than high ones. If the etch rate is to be increased, it is merely necessary to increase the etching temperature accordingly. $H_3PO_4/P_2O_5$ mixtures are essentially less hazardous than solutions containing hyrofluoric acid. As it is not necessary for the $H_3PO_4/P_2O_5$ melts to be heated up to their boiling point, they do not require safety measures beyond those generally taken, in spite of the high temperatures applied.

Materials belonging to the $SiO_2$, the $Si_3N_4$, the silicon oxynitride and the silicon group can be advantageously etched by means of the inventive method. These materials are widely used in semiconductor technology. The advantages of applying the inventive method to these materials reside in the fact that they are individually reproducible and can be accurately etched at low etch rates, as well as concurrently at etch rates adapted to each other. The inventive method permits etching under greatly varying conditions. By determining the composition and — to a certain extent — also the temperature it can be predetermined whether $Si_3N_4$, silicon oxynitride or $SiO_2$ is preferably etched in the presence of one or several of the other materials. The inventive method has the further advantage that process steps can be saved by applying it to the four materials. As previously mentioned, this is attributable to the fact that the $H_3PO_4/P_2O_5$ melt attacks all four materials — although to different degrees. It is also pointed out that the inventive method permits Si to be favorably and concurrently etched with $SiO_2$ and $Si_3N_4$ and silicon oxynitride at an etch rate exceeding that of $SiO_2$, using etchants that preferably etch $Si_3N_4$.

It is advantageous to use melts with $P_2O_5$ contents of less than 64 percent. Above a $P_2O_5$ content of 64 percent the etch rates of $SiO_2$ and $Si_3N_4$ again approach each other, so that etch rate conditions result as are present with a $P_2O_5$ content of about 45 percent. Etch rates within a $P_2O_5$ content range exceeding 64 percent are relatively low at 200°C, so that, in order to raise the etch rates to a reasonable value, it would be necessary to increase the temperature accordingly. This undeniably entails disadvantages in comparison with a $P_2O_5$ range of below about 45 percent.

Selective etching of $Si_3N_4$ in the presence of $SiO_2$ and/or Si is advantageously carried out in melts with $P_2O_5$ contents ranging from 12 to 23 percent, whereas $SiO_2$ is selectively etched in the presence of $Si_3N_4$ and/or Si, using melts with $P_2O_5$ contents of between 23 and 64 percent. Predetermined compositions can be readily produced and maintained.

It is advantageous to etch at fixed constant temperatures ranging from 160° to 300°C. The etch rates obtained from 160°C onward are the minimum ones required for manufacturing purposes. Above 300°C, as the formation of vapor shows, $P_2O_5$ begins evaporating in greater quantities, so that the concentration is uncontrollably changed. It is pointed out that within this temperature range the composition of the melts at the lower $P_2O_5$ contents, as the etching temperatures increase, cannot be kept completely constant for a longer period of time. In such cases it is easy, however, to determine the period of time in which constant etching is possible within the tolerance range, as well as the quantity of water to be added to the melt at regular intervals. These precautions are only necessary if one is not prepared to content oneself with an accurately defined etch rate but rather wishes a fully constant one.

It is advantageous for the melt to be heated to the etching temperature on each working day, to be kept constant at that temperature, to be covered with a lid at the end of the working day, and to be allowed to cool down to room temperature. This temperature cycle permits slight water losses, resulting from the melt being kept at a high etching temperature for hours, to be compensated during cooling down, since below 110°C the melt is hygroscopic. If the etching temperature employed is invariably the same, which is generally the case, it is necessary to determine only once how hermetically the melt must be sealed in the cooled off state, so that evaporated water, if any, can be replenished out of the atmosphere. Using this cycle, the melt can be kept practically constant for at least 10 to 12 working days.

Figure 3:
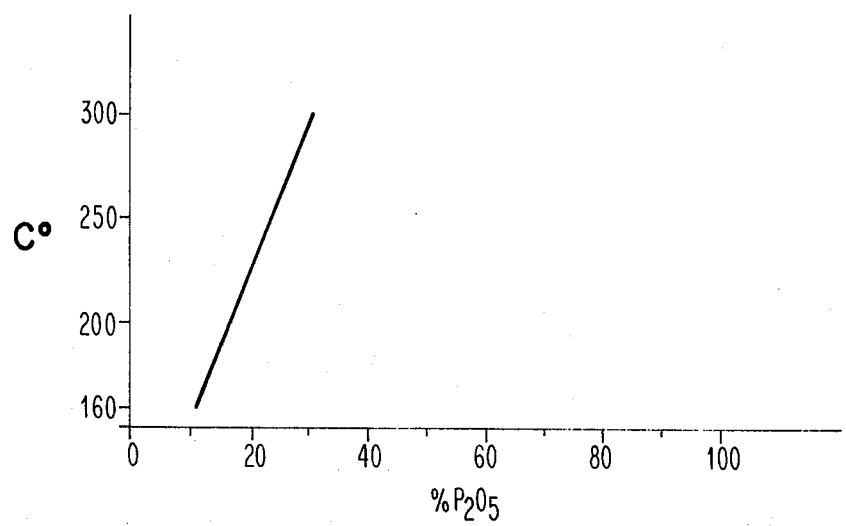
FIG. 3 is a diagram showing the $P_2O_5$ content percentages and the temperatures, above which the melts with the respective $P_2O_5$ contents lose water.

If the emphasis is on extremely constant etch rates and if the etch rates must not fluctuate by more than ± 5 percent, it is advantageous, provided the temperature is strictly adhered to, to choose a maximum etching temperature (T), the relation between the temperature and the $P_2O_5$ content (P) of the melt at temperatures ranging from 160° to 300°C is approximately: $T(°C) = P(\%) \cdot 60°C/10\% + 108°C$. This relation is graphically represented in FIG. 3 illustrating that for each melt composition there is a "characteristic" temperature (T), above which noticeable quantities of water evaporate from the melt. The water originates from $H_3PO_4$ being dissociated into $H_2O$ and $P_2O_5$. As can be seen from the plot, the characteristic temperature rises as the $P_2O_5$ content increases. If etching takes place at a temperature below the characteristic one, there is practically no risk of water escaping from the melt.

For reproducibly etching $Si_3N_4$ in the presence of $SiO_2$ and/or Si or $SiO_2$ in the presence of $Si_3N_4$ and/or Si at an etch rate of 33 A per minute, whereby the deviation from this value must not be more than ± 2.5 A/min. and the other two materials are etched at rates reduced by the factor 0.75 and 0.5, respectively, it is advantageous for the etch process to be performed at a temperature of 200°C, using a melt containing 15 percent $P_2O_5$, or at a temperature of 203°C, using a melt containing 45 percent $P_2O_5$.

If etching in the melt takes place at a temperature below its characteristic one, it is particularly easy to keep its composition constant, provided the melt is maintained at about the etching temperature for its full life.

Solid and chemically resistant materials containing Si are etched mainly in semiconductor technology, whereby, in addition to elementary silicon, $SiO_2$ and $Si_3N_4$ rank high in importance. The etching method described below will be explained in the main in connection with these three materials which are also typical for this group of materials. It is pointed out, however, that the application of the described method is not limited to Si, $SiO_2$ and $Si_3N_4$.

Contrary to other inorganic acids, such as $H_2SO_4$, $H_3PO_4$ is partly dissociated also in the anhydrous state. The resultant autoprotylitic equilibrium is:

The etch effect of the $H_3PO_4/P_2O_5$ melt on $Si_3N_4$ is obviously based on this dissociation, i.e., on the presence of cations. This is borne out by the fact that in the case of a temperature increase in the $H_3PO_4/P_2O_5$ melt, the increase in the etch rate of $Si_3N_4$ is relatively greater than that of $SiO_2$. It is a well recognized fact that a temperature increase leads to the equilibrium of the above-mentioned dissociation equation being shifted to the right.

In the case of the etch effect on silicon, this temperature influence is even more pronounced than with $Si_3N_4$. A corollary of this would be that a similar mechanism applies to silicon and $Si_3N_4$. This is contradicted, however, by the article published in the above-mentioned Journal of Electrochemical Society, according to which the etch rate of silicon in hydrous $H_3PO_4$ is lower than in an $H_3PO_4/P_2O_5$ melt having a $P_2O_5$ content of about 15 percent.

Taking into account the state of the art which could not be confirmed when this specification was prepared, the unexpected etching behavior of $SiO_2$ is even more difficult to explain. It appears certain, however, that cations generated by dissociation are not responsible for the etch effect on $SiO_2$ and that in comparison with hydrous phosphoric acid, other ions or molecules in the $H_3PO_4/P_2O_5$ melt govern the etching of $SiO_2$, at least if its $P_2O_5$ content is above about 12 percent.

By increasing the temperature of the $H_3PO_4/P_2O_5$ melt, the etch rates of $SiO_2$, $Si_3N_4$ and Si are increased. This is not solely the result of the generally known increase in the reaction speed following a temperature rise, but, as previously mentioned, the dissociation of $H_3PO_4$, increasing as the temperature increases, additionally enhances the etch rates of $Si_3N_4$ and Si.

Figure 4:
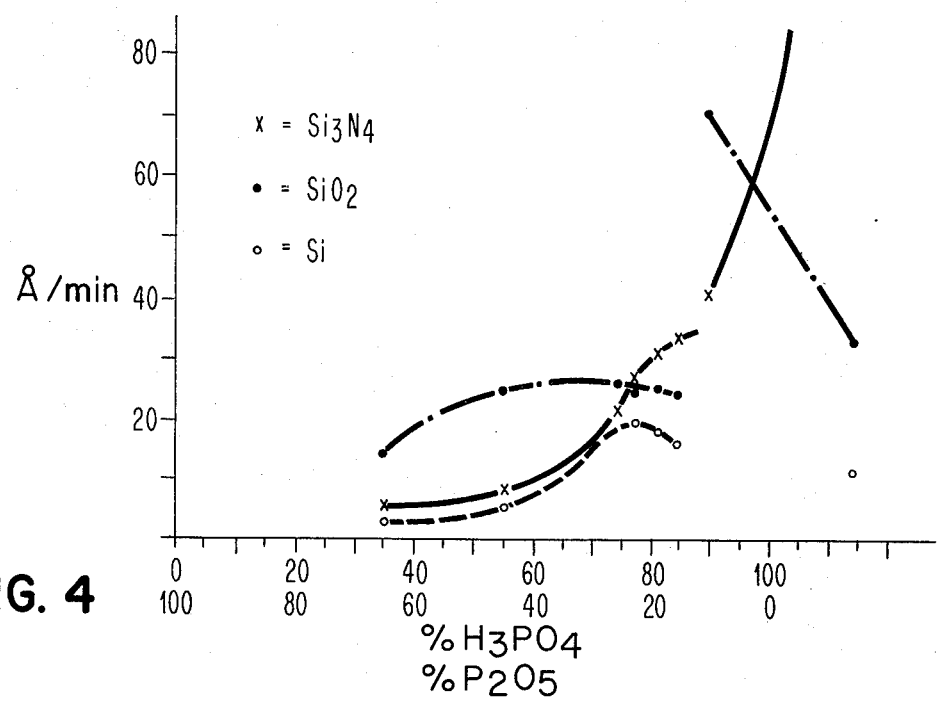
FIG. 4 is a diagram showing the etch rates at 200°C for $Si_3N_4$, $SiO_2$ and Si versus the $H_3PO_4$ or $P_2O_5$ content percentages of the melts.

The $Si_3N_4$, $SiO_2$ and Si etch rate ratio depends in the first place upon the $P_2O_5$ content of the melt and in the second place — as previously indicated — upon the temperature. Thus, it is possible, as is shown in FIG. 4 and as will be explained further on, to etch $Si_3N_4$ preferably or selectively in the presence of $SiO_2$ and Si; $SiO_2$ preferably or selectively in the presence of $Si_3N_4$ and Si, or two of the three materials at about the same etch rate, depending upon the composition of the melt. If, for example, $SiO_2$, $SiO_3N_4$ and Si are concurrently exposed to the $H_3PO_4/P_2O_5$ melt, then all three materials are etched concurrently, although to different degrees, provided that the conditions are chosen correspondingly. The advantages resulting from this will be explained by means of FIGS. 1A to 1C and 2A to 2C.

Figure 1B:
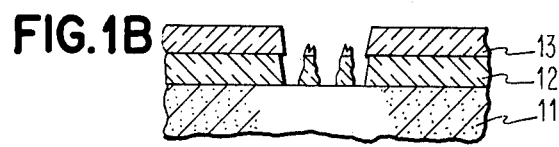
FIG. 1B shows the structure of FIG. 1A after the areas not covered with the mask have been etched away by means of an etchant that solely attacks the layer.
Figure 2B:
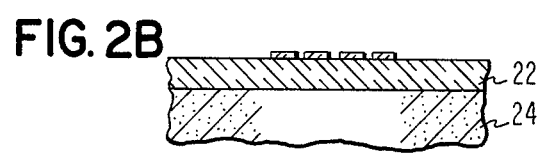
FIG. 2B shows the structure of FIG. 2A after the silicon oxynitride layer has been almost completely removed by means of buffered hydrofluoric acid.
Figure 1C:
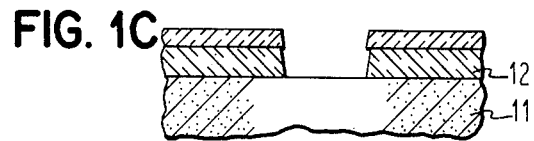
FIG. 1C shows the structure of FIG. 1A after the areas of the layer not covered with the mask have been etched away in accordance with the method of the invention.

FIG. 1A is a cross-sectional view of an $SiO_2$ or $Si_3N_4$ layer 12 disposed on a substrate 11. This layer is to be etched selectively, to which end it is covered with a mask 13 which has been manufactured in a preceding process step, for example, by a photolithographic method and which in the case of an $SiO_2$ layer 12 consists of $Si_3N_4$ or Si or in the case of an $Si_3N_4$ layer 12 is made up of $SiO_2$ or Si. It cannot be prevented altogether that as the mask material is etched, small residues of the mask material are left on the exposed areas of layer 12 on which the mask is superimposed. FIG. 1A shows such residues on the exposed layer 12. If etching of layer 12 is performed by means of an etchant, such as hydrous $H_3PO_4$ in the case of $Si_3N_4$, which attacks only layer 12 but not or hardly at all the mask material ($SiO_2$ or Si), then there is the risk of residual mask material in the window acting as a mask, so that during the etching of layer 12 a structure is obtained, as is shown in FIG. 1B. If, on the other hand, layer 12, in accordance with the method described here, is treated with an etchant that preferably attacks the material of layer 12 and simultaneously, although to a lesser degree, the mask material, then the residues of the mask material within the windows are removed at the beginning of the etch process, so that etching can proceed uniformly over the full window area. The result obtained by applying the inventive method is shown in FIG. 1C. As will be seen from this figure, etching of layer 12 results in the total thickness of mask 13 being reduced. This is no disadvantage, not even in the case of applications necessitating a minimum thickness of the masking layer at the end of etching. In such cases it is merely necessary to ensure that the masking layer is sufficiently thick at the beginning of etching. Even where prior to etching layer 12 residues of the masking material are detected in the windows and removed by an agent that merely etches the masking material, the method described is still advantageous, since the additional etching step is saved.

Figure 2A:
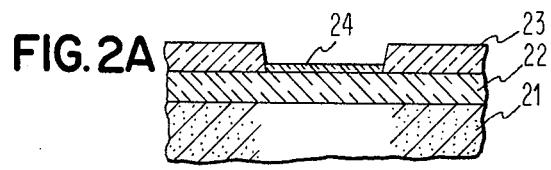
FIG. 2A is a cross-sectional view of an $Si_3N_4$ layer disposed on a substrate and which is covered with an $SiO_2$ mask.
Figure 2C:
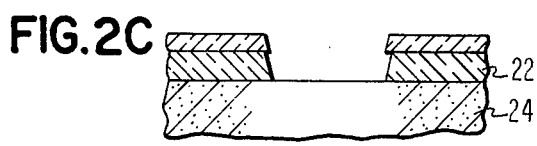
FIG. 2C shows the structure of FIG. 2A after the silicon oxynitride layer and the areas of the $Si_3N_4$ layer not covered with the mask have been etched away by means of the inventive method.

FIG. 2A shows a structure similar to the cross-sectional one of FIG. 1A. In FIG. 2A, however, layer 22 invariably consists of $Si_3N_4$ and mask 23 of $SiO_2$. After this structure has been heat treated in an oxygen atmosphere, a 30 to 50 A thick silicon oxynitride layer 24 inevitably results on $Si_3N_4$ layer 22. Before etching silicon nitride layer 22, this silicon oxynitride layer 24 has to be removed. To this end, one known method uses buffered hydrofluoric acid, the normal etchant for $SiO_2$. Thus, this known method entails an additional etching step. Apart from this, there is the serious risk, particularly in the case of a silicon oxynitride layer of about 50 A thickness, that because of the strong etching effect the buffered hydrofluoric acid has on the silicon dioxide masking material and its relatively slight etching effect on the silicon oxynitride, mask 23 is etched away completely or almost completely, before silicon oxynitride layer 24 has been fully removed. This most unfavorable case is demonstrated by means of FIG. 2B. Application of the inventive method ensures, however, that the silicon oxynitride, combining oxide and nitride characteristics and whose behavior during etching is halfway between that of $SiO_2$ and $Si_3N_4$, and the silicon nitride are etched more rapidly than $SiO_2$, so that the thin silicon oxynitride layer 24 and the exposed silicon nitride can be etched away in one etching step without destroying mask 23. The result of this etching operation is shown in FIG. 2C.

It is obvious that constant and reproducible etch rates have to be adhered to when implementing the process cycle explained by means of FIGS. 1A and 1C, 2A and 2C. This is warranted by the method described here. It is known though that $H_3PO_4/P_2O_5$ melts which are heated above a characteristic temperature, which is a function of the composition and the conditions under which heating is effected, emit sizable quantities of water. Accordingly, their composition shifts towards higher $P_2O_5$ contents. When the method described here was devised, it was experimentally established that a characteristic temperature of 200°C is typical for a melt having a $P_2O_5$ content of about 15 percent, being contained in an open beaker and being stirred by means of a magnetic stirrer. Changes in the characteristic temperature that occur as the composition changes can be determined from known measured values. In the range between 160° and 300°C, this change in the characteristic temperature is about linear. A corresponding plot is shown in FIG. 3. The straight line in this figure has a slope that was derived from the known measured values and extends through the experimentally established characteristic temperature (200°C) of the 15 percent $P_2O_5$ melt. Between 160° and 300°C the relation $T(°C) = P(\%) \cdot 60°C/10\% + 108°C$ exists between the characteristic temperature (T) and the $P_2O_5$ content (P) of its associated melt. As long as one proceeds along or below the straight line, the composition of the melt will remain constant for a random period of time, provided there is no water absorption. Water absorption is only possible below 110°C. It is recommendable to work under these conditions if an extremely constant etch rate at very narrow tolerances is desirable. However, to this end it is necessary that also the etching temperature is kept extremely constant, which in most cases entails unnecessary expenditure. To elaborate on what has been said above, it is pointed out that a melt containing 15 percent $P_2O_5$ and which was applied at 200° ± 3°C, the initial $Si_3N_4$ etch rate of 33 ± 2.5 A/min. was still measured after 100 operating hours. Of course, it is also possible to etch at a constant etch rate even at temperatures above the characteristic one. It will be seen from the diagram of FIG. 4, which is described in detail below, that the $SiO_2$ etch rate at a $P_2O_5$ content of between 18.5 and 45 percent, and the Si etch rate at a $P_2O_5$ content of between 16 and 25.5 percent are little dependent upon the composition of the melt, and that the increase in the $Si_3N_4$ etch at a $P_2O_5$ content of between 16 and 22 percent is relatively smaller than in the case of highly concentrated hydrous $H_3PO_4$. This means, in other words, that a little, or in the case of $SiO_2$ and Si even a greater, change in the composition of the melt does not lead to an essential change in the etch rate. As the water is not a priori present in the melt, but has to be formed by chemical reaction, there is the additional factor that the water evaporates only very slowly; the slower, of course, the smaller the difference is between the etching temperature and the characteristic temperature. As long as the etching temperature is not permitted to exceed the characteristic temperature by more than 30°C, the etch rate — as referred to $Si_3N_4$ — is not likely to drop by more than 8 percent during a heating period of 8 hours. Eight percent is within the generally accepted tolerance limits. In addition, having cooled down to room temperature after use, the melt becomes hygroscopic below 110°C, so that it absorbs water. By suitable measures, for example, by using a lid that seals more or less tightly it is possible, given a predetermined operating period and temperature, to accurately and reproducibly compensate the water loss incurred in the heated state, thus restoring the etch rate to its original value. At temperatures exceeding the characteristic temperature by more than 30°, the etch rate can no longer be kept constant within the acceptable tolerance limits beyond a period of 8 hours. The period of time during which etching can be carried out at a constant rate decreases as the difference between the etching temperature and the characteristic temperature increases. However, even if it is no longer possible to keep a constant etch rate at the higher temperatures, etching can still be performed at an accurately defined rate, for the change in the etch rate at the high temperatures is strictly a function of the duration of operation and thus reproducible and controllable on the basis of this duration.

A temperature exceeding 300°C is generally not used, because beyond this temperature $P_2O_5$ begins to escape, which is detectable from the formation of vapor. This leads to an uncontrollable change in the composition and thus in the etching effect of the melt. As the characteristic temperature of 300°C is associated with a melt having a $P_2O_5$ content of about 31.5 percent, it is at best recommendable for melts having a $P_2O_5$ content of <31.5 percent to etch above the characteristic temperature. It has to be considered, however, that because of the great increase in the etch rate concurrently with the temperature, a steep increase in the temperature is hardly ever desirable. At a temperature increase of, for example, 40°C the etch rate for $Si_3N_4$ increases roughly by the factor 7 in a 45 percent $P_2O_5$ melt. This means, for example, when the 15 percent $P_2O_5$ melt is heated from 200° to 240°C, the etch rate of $Si_3N_4$ increases from 33 to 260 A/min. An etch rate of this magnitude is too high to ensure accurate etching results in conjunction with an $Si_3N_4$ layer thickness of several 100 A. A decrease in temperature has a similarly pronounced, although reverse, effect on the etch rates. Therefore, when using the described method for manufacturing purposes, acceptable etch rates can only be obtained above 160°C.

The $H_3PO_4/P_2O_5$ melt necessary for implementing the described method can be produced in two ways: a melt of a predetermined composition is obtained most readily by adding a calculated quantity of $P_2O_5$ to a defined quantity of commercially available phosphoric acid, i.e., a phosphoric acid containing about 15 percent water. One part of the calculated quantity of $P_2O_5$ reacts with the water contained in the commercially available phosphoric acid, forming $H_3PO_4$, whereas the other part serves to ensure the desired $H_3PO_4/P_2O_5$ ratio. When the $P_2O_5/H_3PO_4$ mixture is subsequently heated to temperatures above 160°C, a homogeneous, clear melt is obtained whose viscosity and glasslike nature are retained even during cooling down. The second manufacturing process which is essentially more time-consuming than the first and thus is applied less frequently consists in commercial phosphoric acid being heated to the temperature at which the melt is to be used later or to a temperature exceeding that temperaure until the quantity of escaped water is such that the required $H_3PO_4/P_2O_5$ ratio is ensured. In order to warrant that the generated melt has the desired composition, it is easiest in the case of the first manufacturing process to determine the exact concentration of the commercial phosphoric acid. The acid concentration is determined by acidimetric titration, using 0.5 normal NaOH. As the phosphoric acid and the $P_2O_5$ can be weighed very accurately, the composition of the melt can be accurately and reliably calculated on the basis of the phosphoric acid analysis. An analytical determination of the ingredients of the finished melt would be rather time-consuming. In the case of the second manufacturing process the composition of the finished melt can be determined from the concentration of the phosphoric acid which is used as a basis, from the heating period and from the temperature applied. The $H_3PO_4/P_2O_5$ ratio in the generated melt can then be accurately determined from the etch rates obtained.

To demonstrate the method described here, silicon wafers can be used which prior to etching were either HF treated to remove any impurities and oxide deposits, i.e., which show the bare Si, or on which $SiO_2$ or $Si_3N_4$ layers were grown. The melts are contained in a quartz beaker which is preferably teflon coated. For heating and stirring the melt, it is advantageous for the quartz beaker to be placed on a magnetic stirrer combined with a hot plate. The temperature of the melt can be controlled by means of a contact thermometer standing in the melt. Subsequently, the melt is heated to the required etching temperature and is ready for etching if it does not deviate by more than ± 3° C from the etching temperature. The test samples in a horizontal position are individually exposed to the melt for a predetermined time, during which the melt is stirred. After etching, the test samples are immediately suspended in running deionized water.

To determine the etch rate, the test wafers are weighed before and after etching, and the removed layer thickness is calculated from the weight difference by means of the equation:

$$d = \Delta G/F \cdot p$$

where
  $d$ = the removed layer thickness,
  $F$ = the wafer surface,
  $p$ = the thickness of the material to be etched (in the case of $Si_3N_4$ = 3.2 g/cm$^3$), and
  $\Delta G$ = the established weight difference.

After etching, the melt covered with a lid is permitted to cool down. In order to make it again ready for etching, all that is necessary is to reheat it to the etching temperature. It is also possible to maintain the etching temperature for the whole life of the melt, provided this temperature is ≤ than the characteristic one.

The inventive method will be described in greater detail below by means of examples.

EXAMPLE I 320 g of $P_2O_5$ were added in portions to 500 g of commercial 85 percent, i.e., hydrous, $H_3PO_4$ (density 1.71), from which a homogeneous melt was obtained by heating. The melt thus obtained contained 15 percent $P_2O_5$. After it had been set to 200° ± 3° C, the melt was ready for etching. In this melt which was stirred and which was contained in a teflon coated quartz beaker 15 silicon wafers, five of which were respectively covered with an $SiO_2$ and an $Si_3N_4$ layer or showed the bare silicon, were etched in a horizontal position for a predetermined period of time. For every five test samples the etch rate established for $Si_3N_4$ was 33 ± 2.5 A, for $SiO_2$ 24 ± 1.2 A per minute and for Si 16 ± 0.8 A per minute. After the melt had been covered with a lid after each use, been allowed to cool down and been reheated before being reused, the etch rates established for test samples that had been identically prepared and subsequently been treated in the same melt were of the same magnitude as those applied during the first etch process, even after 100 operating hours. Wafers on which the silicon nitride layers had been grown were also etched at 160° and 180° C in the same melt. For these etch processes the reproducible results were 6.5 and 13 A per minute, respectively.

EXAMPLES II TO IV

In the case of examples II to IV, too, silicon wafers were etched on which the $Si_3N_4$ or $SiO_2$ layers had been grown or which showed the bare silicon, applying the same conditions as in example I but using different temperatures for examples III and IV and different melt compositions. In the case of example II, the etch rates for five differently composed melts were established at 200° C. In examples III and IV the etch rates of two of the melts used in example II were determined at one higher temperature each.

TABLE I

| Example No. | Temp. in °C | Composition in % $P_2O_5$ | $H_3PO_4$ | Etch Rates A/min. $Si_3N_4$ | $SiO_2$ | Si |
|---|---|---|---|---|---|---|
| II | 200 | 18.5 | 81.5 | 32 | 25 | 18 |
|  |  | 22 | 78 | 28 | 24.5 | 26 |
|  |  | 25.5 | 74.5 | 20 | 26 | 19 |
|  |  | 45 | 55 | 8 | 25 | 6 |
|  |  | 64 | 36 | 4 | 14 | 2.5 |
| III | 240 | 45 | 55 | 55 | 130 | 62 |
| IV | 290 | 64 | 36 | 282 | 445 | 280 |

Table I is a breakdown of the temperatures, the compositions of the melts and the $Si_3N_4$, $SiO_2$ and Si etch rates determined for the three examples.

Figure 5:
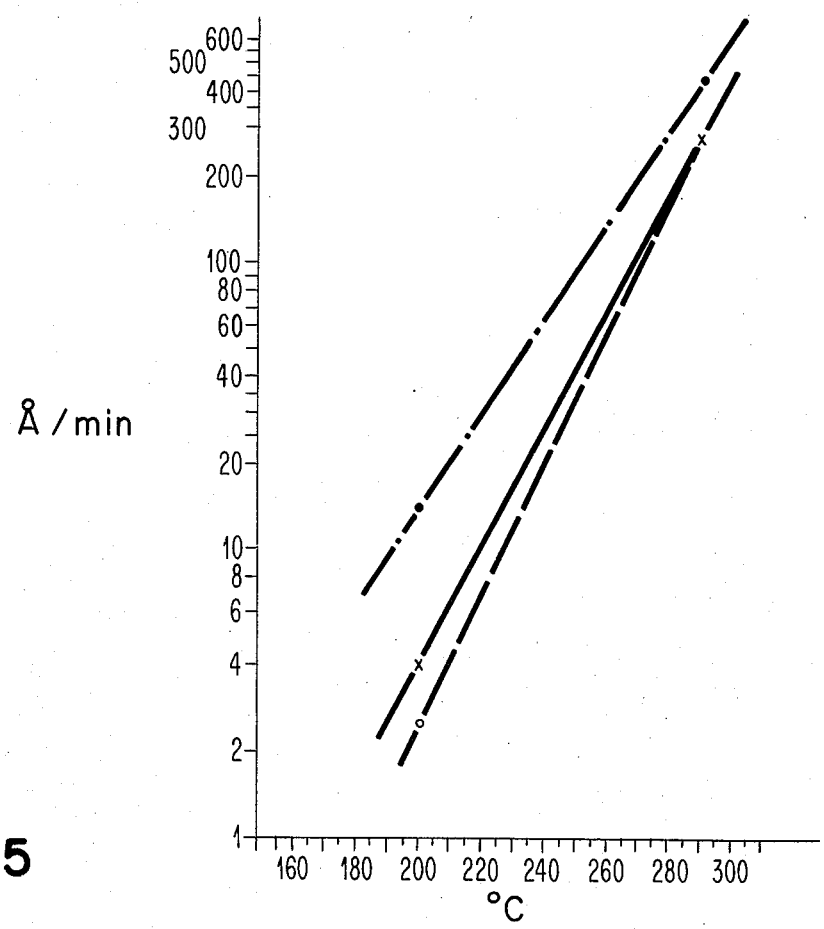
FIG. 5 is a diagram of the etch rates for $Si_3N_4$, $SiO_2$ and Si, using a melt containing 64 percent $P_2O_5$ as a function of the temperature.

The etch rates determined for examples I and II are also shown in FIG. 4 as a function of the composition of the melt. In the figure, the etch rates determined for examples I and II are connected to each other by heavy lines. The plots seem to show quite clearly that in melts having a $P_2O_5$ content of between 16 and 23 percent $Si_3N_4$ is etched selectively, i.e., more strongly than $SiO_2$ and Si, whereby the etch rate ratio can still be influenced by the temperature and that by means of melts having a $P_2O_5$ content exceeding 23 percent $SiO_2$ is etched selectively, i.e., more strongly than $Si_3N_4$ and Si. The insusceptibility of the etch rate to changes in the composition for specific $P_2O_5$ contents, as shown in FIG. 4, has been explained above. The etch rates determined at 290° C in example IV and the etch rates determined in the same melt at 200° C are logarithmically represented with respect to the temperature of FIG. 5. In addition to the great increase in the etch rates as the temperature increases, the plot shows the relative increase in the etch rates of $Si_3N_4$ and Si in comparison with $SiO_2$ as the temperature increases.

The plots marked by weak lines and the solitary etch rate of silicon on the right of the 0% $P_2O_5$ mark respectively illustrate the interdependence between the etch rates, the composition of the melts and the concentration of the hydrous phosphoric acid, which are taken from the above-mentioned prior art material in the Journal of the Electrochemical Society. The course of the plots indicates that probably at least the etch rate of $SiO_2$ must be wrong when applied, in accordance with the above-mentioned publication, to a melt whose $P_2O_5$ content is inaccurately stated to be >10.4 percent.

While the invention has been particularly shown and described with reference to the preferred embodiments thereof, it will be understood by those skilled in the art that various changes in form and details may be made therein without departing from the spirit and scope of the invention.

What is claimed is:

1. A method of etching silicon materials selected from the group consisting of silicon dioxide, silicon nitride, silicon oxynitride and silicon comprising the steps of:
   forming a melt consisting essentially of anhydrous phosphoric acid and between about 12 to 64% by weight of said melt of phosphorous pentoxide, and etching said materials with said melt at a predetermined constant temperature ranging from 160° to 300°C.

2. The method in accordance with claim 1, in which melts with $P_2O_5$ contents of between 12 and 23% are used to selectively etch $Si_3N_4$ in the presence of $SiO_2$ and/or Si.

3. The method in accordance with claim 2 in which the etching is performed by means of a melt containing 15% $P_2O_5$ at a temperature of 200°C.

4. The method in accordance with claim 1, in which melts with $P_2O_5$ contents of between 23 and 64% are used to selectively etch $SiO_2$ in the presence of $Si_3N_4$ and/or Si.

5. The method in accordance with claim 4, in which etching is performed by means of a melt containing 45% $P_2O_5$ at a temperature of 203°C.

6. The method in accordance with claim 1 in which on each working day the melt is heated to the operating temperature, is kept constant at this temperature, is covered with a lid upon completion of work and is cooled down to room temperature.

7. The method in accordance with claim 1 in which the maximum temperature (T) chosen for etching is such that the approximate relation $T(°C) = P(\%) \cdot 60°C/10\% + 108°C$ exists with regard to a $P_2O_5$ content (P) of the melt used at between 160° and 300°C.

8. In a method of etching to remove portions of a layer of a first silicon compound in which an etch mask of a second silicon compound is formed on said layer by overcoating said layer with said second silicon compound and removing portions of said second silicon compound to expose the underlying portions of said layer; the improvement which comprises etching said layer with a hot melt consisting essentially of $P_2O_5$ and anhydrous $H_3PO_4$ containing from about 12 to 64% by weight of melt of $P_2O_5$ at a temperature ranging from 160° to 300°C which melt preferentially etches said first silicon compound but which etches said second silicon compound to a degree such that any residual second silicon compound, which was not removed from the portions of said layer to be etched in forming the etch mask, will be removed by the hot melt so that it does not interfere with the complete removal of said layer in the exposed areas.

9. The method in accordance with claim 8 in which melts with a $P_2O_5$ content of between about 12 and 23% by weight are used to selectively etch a layer of $Si_3N_4$ in the presence of a $SiO_2$ mask.

10. The method in accordance with claim 8 in which melts with a $P_2O_5$ content of between about 23 and 64% by weight are used to selectively etch a layer of $SiO_2$ in the presence of a $Si_3N_4$ mask.

* * * * *